US009899988B2

(12) United States Patent
Yu et al.

(10) Patent No.: US 9,899,988 B2
(45) Date of Patent: Feb. 20, 2018

(54) SWITCH, ANTENNA TUNER, AND RADIO FREQUENCY APPARATUS

(71) Applicant: Huawei Technologies Co., Ltd., Shenzhen (CN)

(72) Inventors: Yongchang Yu, Shanghai (CN); Tao Liu, Shanghai (CN); Weinan Li, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 335 days.

(21) Appl. No.: 14/710,244

(22) Filed: May 12, 2015

(65) Prior Publication Data
US 2015/0326207 A1 Nov. 12, 2015

(30) Foreign Application Priority Data
May 12, 2014 (CN) .......................... 2014 1 0197743

(51) Int. Cl.
*H03J 5/14* (2006.01)
*H04W 88/00* (2009.01)
(Continued)

(52) U.S. Cl.
CPC ................ *H03J 5/14* (2013.01); *H03K 17/10* (2013.01); *H03K 17/60* (2013.01); *H03K 17/687* (2013.01);
(Continued)

(58) Field of Classification Search
CPC ...... H03J 2200/00; H03J 2200/06; H03J 5/00; H03J 5/14; H03K 17/00; H03K 17/04123;
(Continued)

(56) References Cited

U.S. PATENT DOCUMENTS 8,008,988 B1   8/2011   Yang et al.
8,058,922 B2   11/2011  Cassia
(Continued)

FOREIGN PATENT DOCUMENTS

CN   101702627 A   5/2010
CN   101794793 A   8/2010

OTHER PUBLICATIONS

Whatley et al., "CMOS Based Tunable Matching Networks for Cellular Handset Applications," 2011 IEEE MTT-S International Microwave Symposium Digest, Institute of Electrical and Electronics Engineers, New York, New York (Jun. 5-10, 2011).
(Continued)

*Primary Examiner* — Lincoln Donovan
*Assistant Examiner* — David Mattison
(74) *Attorney, Agent, or Firm* — Leydig, Voit & Mayer, Ltd.

(57) ABSTRACT

A switch, an antenna tuner, and a radio frequency apparatus are provided. The switch includes: 2N successively serially connected transistors. In the 2N successively serially connected transistors, control ends of any two transistors with closest odd sequence numbers are coupled to each other through a first resistor, and control ends of any two transistors with closest even sequence numbers are coupled to each other through a second resistor; a control end of an n-th transistor is coupled to a first control signal in a switch control signal, and a control end of an (n+1)-th transistor is coupled to the first control signal, where n is an integer that is greater than or equal to 1 and is less than or equal to 2N−1, N is an integer greater than or equal to 2, and the first control signal is used to control turn-on or turn-off of the switch.

20 Claims, 8 Drawing Sheets

(51) Int. Cl.
*H04B 1/04* (2006.01)
*H03K 17/60* (2006.01)
*H03K 17/687* (2006.01)
*H03K 17/693* (2006.01)
*H03K 17/10* (2006.01)

(52) U.S. Cl.
CPC .............. *H04B 1/04* (2013.01); *H04W 88/00* (2013.01); *H03J 2200/06* (2013.01); *H03K 17/102* (2013.01); *H03K 17/693* (2013.01); *H03K 2217/0018* (2013.01); *H03K 2217/0054* (2013.01)

(58) Field of Classification Search
CPC .. H03K 17/063; H03K 17/0822; H03K 17/10; H03K 17/102; H03K 17/60; H03K 17/687; H03K 17/693; H03K 2217/00; H03K 2217/0018; H03K 2217/0036; H03K 2217/0054; H04B 1/00; H04B 1/04; H04W 88/00
USPC ........................................................ 327/427
See application file for complete search history.

(56) References Cited

U.S. PATENT DOCUMENTS

| | | | |
|---|---|---|---|
| 8,395,435 B2 | 3/2013 | Cassia et al. | |
| 8,461,903 B1 | 6/2013 | Granger-Jones | |
| 9,209,801 B2 | 12/2015 | Matsuno | |
| 2008/0192807 A1 | 8/2008 | Castaneda et al. | |
| 2012/0292703 A1 | 11/2012 | Goto et al. | |
| 2013/0015902 A1* | 1/2013 | Kim | H03K 17/693 327/407 |
| 2013/0241033 A1 | 9/2013 | Murakami | |
| 2013/0249619 A1* | 9/2013 | Granger-Jones | H03K 17/04 327/374 |
| 2014/0009214 A1 | 1/2014 | Altunkilic et al. | |
| 2014/0118053 A1 | 5/2014 | Matsuno | |
| 2014/0266415 A1* | 9/2014 | Kerr | H03K 17/693 327/552 |

OTHER PUBLICATIONS

Lee et al., "Modeling of SOI FET for RF Switch Applications," 2010 IEEE Radio Frequency Integrated Circuits Symposium, Institute of Electrical and Electronics Engineers, New York, New York (May 23-25, 2010).

Tinella et al., "0.13μm CMOS SOI SP6T Antenna Switch for Multi-Standard Handsets," 2006 Topical Meeting on Silicon on Monolithic Integrated Circuits in RF Systems, Institute of Electrical and Electronics Engineers, New York, New York (Jan. 18-20, 2006).

* cited by examiner

SWITCH, ANTENNA TUNER, AND RADIO FREQUENCY APPARATUS

CROSS-REFERENCE TO RELATED APPLICATIONS

This application claims priority to Chinese Patent Application No. 201410197743.2, filed on May 12, 2014, which is hereby incorporated by reference in its entirety.

TECHNICAL FIELD

The present invention relates to the field of electronic technologies, and in particular, to a switch, an antenna tuner, and a radio frequency apparatus.

BACKGROUND

With the development of wireless communications technologies, a mobile communications device generally needs to support multimode and multiband requirements, which requires that, on the mobile communications device, an antenna not only needs to support switching from a transmit mode to a receive mode, but also needs to meet the multimode and multiband requirements.

Figure 1:
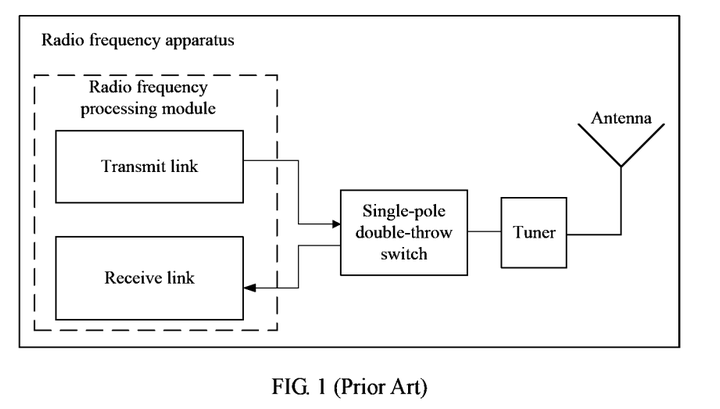
FIG. 1 is a simplified schematic diagram of a radio frequency apparatus according to the prior art.

In a radio frequency apparatus, there are a transmit link and a receive link, and the transmit link and the receive link may be collectively called a radio frequency processing module. When the radio frequency processing module determines to perform at least one of signal sending and signal receiving, at least one of the transmit link and the receive link needs to be selectively connected to an antenna, where the selective connection is generally implemented by using a SPDT (Single-Pole Double-Throw, single-pole double-throw) switch, as shown in FIG. 1. A radio frequency processing module in FIG. 1 includes a transmit link and a receive link, and when the SPDT switch connects the antenna to the transmit link, the transmit link is configured to modulate a baseband signal to obtain a radio frequency signal, and the antenna is configured to send the radio frequency signal that is obtained after the modulation. When the SPDT switch connects the antenna to the receive link, the receive link is configured to demodulate a signal received by the antenna. In order to optimize antenna efficiency, a tuner, acting as an apparatus for adjusting antenna impedance matching, is introduced into the radio frequency apparatus. The tuner may be an impedance matching network that is connected between the radio frequency module and the antenna, and is capable of performing impedance matching processing on the antenna, so as to optimize transmit performance of the antenna. As shown in FIG. 1, the tuner may be coupled between the antenna and the SPDT switch. Optionally, the antenna tuner may also be coupled between the SPDT switch and the radio frequency module. The tuner generally includes switches, capacitors, a resistor, an inductor, or another component. A control signal is used to control turn-on or turn-off of multiple switches in the tuner, so as to change a connection relationship between capacitors in the tuner or between a capacitor and another component that are in the tuner, for example, a connection relationship between the inductor and the resistor, to tune a radio frequency signal to be input to the antenna, where the circuit formed by the switch and the capacitor is also called a digitally tunable capacitor (Digitally Tunable Capacitor, DTC). Therefore, performance of the switch in the tuner affects operation of the tuner to a large degree.

Figure 2A:
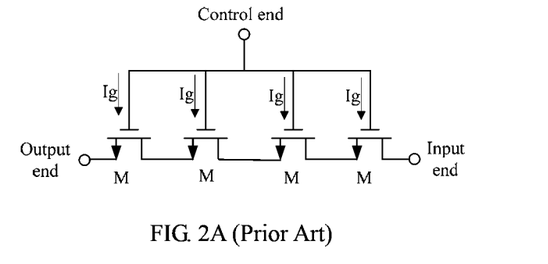
FIG. 2A is a simplified schematic diagram of a switch in an antenna tuner according to the prior art.
Figure 2B:
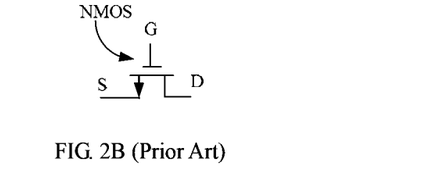
FIG. 2B is a simplified schematic diagram of an NMOS transistor according to the prior art.

The switch in the tuner may be as shown in FIG. 2A. In order not to be broken down in a case in which a high-power control signal is borne, the switch in the tuner needs to apply a design in which multiple transistors are stacked, where stacking refers to serial connection of the multiple transistors. Illustration is provided in FIG. 2A by using an example, in which multiple MOS (Metal-Oxide-Semiconductor, metal-oxide-semiconductor) transistors are serially connected, the multiple serially connected MOS transistors act as a switch, and the switch has an input end configured to input a signal, an output end configured to output a signal, and a control end. The control end of the switch receives a control signal, and under control of the control signal, turns on or turns off the switch. When the switch is turned on, a signal input by the input end is transmitted to the output end; and when the switch is turned off, an input signal is not transmitted to the output end. A gate and a source of each MOS transistor have large parasitic capacitance, and therefore a high-power high-frequency control signal of the gate may be directly coupled to the source, that is, output of the MOS transistor is affected, so that resistance between the gate and the control signal needs to be increased for isolation; otherwise, a gate leakage current, that is, a current leaking from the gate, is fairly large, which causes a large signal loss, thereby deteriorating performance of the switch. In FIG. 2A, involved MOS transistors are all NMOS (N-Metal-Oxide-Semiconductor, N-metal-oxide-semiconductor) transistors, each of which is indicated by a mark M. A gate leakage current of each NMOS transistor is indicated by Ig. A schematic diagram of one NMOS transistor may be as shown in FIG. 2B, which includes a source S, a gate G, and a drain D. When the gate G is at a high voltage level, the NMOS transistor is on, the source S and the drain D are connected, and an input of the drain D is conducted to the source S; and when the gate G is at a low voltage level, the NMOS transistor is off, and a path from the drain D to the source S is blocked.

Figure 2C:
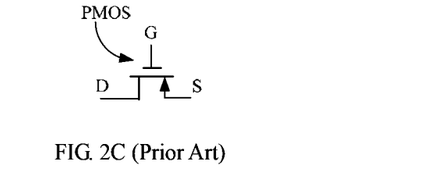
FIG. 2C is a simplified schematic diagram of a PMOS transistor according to the prior art.

Definitely, when the switch is manufactured by using an integrated circuit process, other different types of transistors may also be used, for example, a PMOS (P-Metal-Oxide-Semiconductor, P-metal-oxide-semiconductor) transistor may also be used to replace the NMOS transistor. A schematic diagram of the PMOS transistor may be as shown in FIG. 2C. Different from that in an NMOS, in the PMOS transistor, when a gate G is at a high voltage level, an input path from a source S to a drain D is blocked; and when the gate G is at a low voltage level, an input of the source S is conducted to the drain D.

Figure 3:
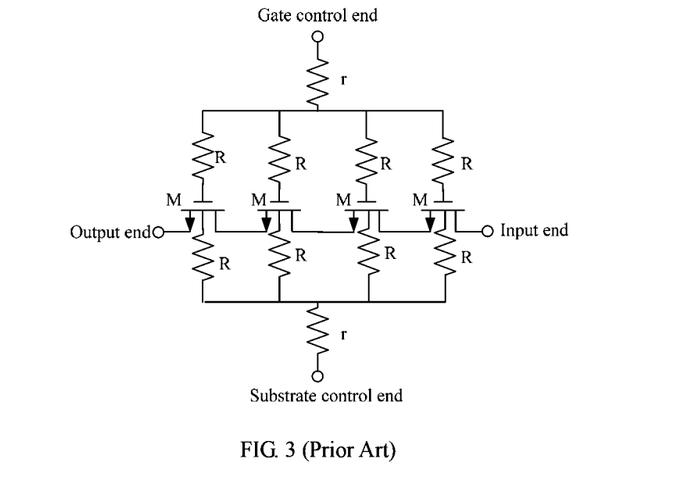
FIG. 3 is a simplified schematic diagram of a switch having multiple serially connected MOS transistors according to the prior art.

When an isolation resistor is added to a transistor to reduce a leakage current, according to the prior art, in multiple serially connected MOS transistors, a gate of each MOS transistor is connected to an isolation resistor to reduce the gate leakage current Ig, and an isolation resistor similar to that of the gate may also be added to a substrate of each transistor, so as to reduce a substrate leakage current. As shown in FIG. 3, multiple NMOS transistors M are serially connected, the gate and the substrate of each NMOS transistor may be both coupled to a gate control signal and a substrate control signal respectively through isolation resistors R, but these isolation resistors R are not directly connected to the gate control signal and the substrate control signal, and instead, these isolation resistors R are further connected to the gate control signal and the substrate control signal through one resistor r, so as to reduce the leakage current. However, the gate or the substrate of each transistor is connected to only two serially connected resistors R and r, so that a degree of isolation may not meet a requirement in some scenarios.

Figure 4:
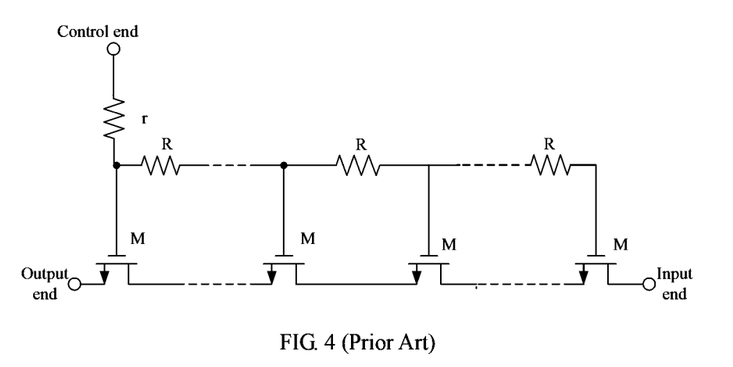
FIG. 4 is a simplified schematic diagram of another switch having serially connected MOS transistors according to the prior art.

In order to further improve a degree of gate resistor isolation of the multiple serially connected MOS transistors, another prior art proposes a connection relationship between the MOS transistors and the resistors, as shown in FIG. 4. In a series of serially connected MOS transistors, each transistor is indicated by M, a gate of each MOS transistor and a gate of an MOS transistor adjacent to the MOS transistor are connected through a gate resistor R, and a gate resistor of the MOS transistor close to an output end is connected to one resistor r, so that a control signal is received through the resistor r, and therefore resistor isolation from the control signal to the transistor is improved. Because a quantity of serially connected resistors from the gate of a transistor close to an input end to a switch control end is increased, the degree of isolation is improved accordingly. However, for the transistor close to the input end, as a quantity of serially connected resistors that are coupled to the control end increases, a transmission delay of a signal from the control end to the gate of the transistor increases, so that transmission efficiency of the entire switch is reduced. Therefore, how an excessive loss of the transmission efficiency is to be avoided when a leakage current of a transistor is reduced becomes a problem.

SUMMARY

Embodiments of the present invention provide a switch, an antenna tuner, and a radio frequency apparatus, so as to comprehensively adjust transmission efficiency of a switch including multiple serially connected transistors and suppress a leakage current.

According to a first aspect, an embodiment of the present invention provides a switch, including: 2N successively serially connected transistors, where the 2N successively serially connected transistors include a first transistor to a 2N-th transistor, and N is an integer greater than or equal to 2; the 2N successively serially connected transistors are divided into transistors in an odd-number group and transistors in an even-number group; the transistors in the odd-number group include the first transistor, the third transistor, . . . , and the (2N−1)-th transistor; and the transistors in the even-number group include the second transistor, the fourth transistor, . . . , and the 2N-th transistor; in the transistors in the odd-number group, control ends of any two transistors with closest odd sequence numbers are coupled to each other through a first resistor; in the transistors in the even-number group, control ends of any two transistors with closest even sequence numbers are coupled to each other through a second resistor; in the 2N successively serially connected transistors, a control end of an n-th transistor is coupled to a first control signal in a switch control signal, and a control end of an (n+1)-th transistor is coupled to the first control signal, where n is an integer that is greater than or equal to 1 and is less than or equal to 2N−1, and the first control signal is used to control turn-on or turn-off of the switch.

According to the first aspect, in a first possible implementation manner of the first aspect, the control end of the n-th transistor is coupled to the first control signal through a third resistor, and the control end of the (n+1)-th transistor is coupled to the first control signal through a fourth resistor.

According to the first possible implementation manner of the first aspect, in a second possible implementation manner of the first aspect, a first end of the third resistor is connected to the control end of the n-th transistor, and a second end of the third resistor is connected to a first end of a fifth resistor; a first end of the fourth resistor is connected to the control end of the (n+1)-th transistor, and a second end of the fourth resistor is connected to the first end of the fifth resistor; and a second end of the fifth resistor is coupled to the first control signal.

According to the second possible implementation manner of the first aspect, in a third possible implementation manner of the first aspect, n is further an odd number; the control end of the n-th transistor is connected to the third resistor through an eleventh resistor, and the control end of the n-th transistor and at least one first resistor that is connected to the n-th transistor are coupled to each other through the eleventh resistor; and the control end of the (n+1)-th transistor is connected to the fourth resistor through a twelfth resistor, and the control end of the (n+1)-th transistor and at least one second resistor that is connected to the (n+1)-th transistor are coupled to each other through the twelfth resistor.

According to the second possible implementation manner of the first aspect, in a fourth possible implementation manner of the first aspect, n is further an even number; the control end of the n-th transistor is connected to the third resistor through an eleventh resistor, and the control end of the n-th transistor and at least one second resistor that is connected to the n-th transistor are coupled to each other through the eleventh resistor; and the control end of the (n+1)-th transistor is connected to the fourth resistor through a twelfth resistor, and the control end of the (n+1)-th transistor and at least one first resistor that is connected to the (n+1)-th transistor are coupled to each other through the twelfth resistor.

According to the first aspect or any one of the forgoing possible implementation manners of the first aspect, in a fifth possible implementation manner of the first aspect, in the transistors in the odd-number group, substrates of any two transistors with closest odd sequence numbers are coupled to each other through a sixth resistor; and in the transistors in the even-number group, substrates of any two transistors with closest even sequence numbers are coupled to each other through a seventh resistor; where a substrate of the n-th transistor is coupled to a second control signal in the switch control signal, a substrate of the (n+1)-th transistor is coupled to the second control signal, and the second control signal is used to control voltage levels of substrates of the 2N successively serially connected transistors.

According to the fifth possible implementation manner of the first aspect, in a sixth possible implementation manner of the first aspect, the substrate of the n-th transistor is coupled to the second control signal through an eighth resistor, and the substrate of the (n+1)-th transistor is coupled to the second control signal through a ninth resistor.

According to the sixth possible implementation manner of the first aspect, in a seventh possible implementation manner of the first aspect, a first end of the eighth resistor is connected to the substrate of the n-th transistor, and a second end of the eighth resistor is connected to a first end of a tenth resistor; a first end of the ninth resistor is connected to the substrate of the (n+1)-th transistor, and a second end of the ninth resistor is connected to the first end of the tenth resistor; and a second end of the tenth resistor is coupled to the second control signal.

According to the seventh possible implementation manner of the first aspect, in an eighth possible implementation manner of the first aspect, n is further an odd number; the substrate of the n-th transistor is connected to the eighth resistor through a thirteenth resistor, and the substrate of the n-th transistor and at least one sixth resistor that is connected to the n-th transistor are coupled to each other through the thirteenth resistor; and the substrate of the (n+1)-th transistor is connected to the ninth resistor through a fourteenth resistor, and the substrate of the (n+1)-th transistor and at least one seventh resistor that is connected to the (n+1)-th transistor are coupled to each other through the fourteenth resistor.

According to the seventh possible implementation manner of the first aspect, in a ninth possible implementation manner of the first aspect, n is further an even number; the substrate of the n-th transistor is connected to the eighth resistor through a thirteenth resistor, and the substrate of the n-th transistor and at least one seventh resistor that is connected to the n-th transistor are coupled to each other through the thirteenth resistor; and the substrate of the (n+1)-th transistor is connected to the ninth resistor through a fourteenth resistor, and the substrate of the (n+1)-th transistor and at least one sixth resistor that is connected to the (n+1)-th transistor are coupled to each other through the fourteenth resistor.

According to the first aspect or any one of the forgoing possible implementation manners of the first aspect, in a tenth possible implementation manner of the first aspect, a value of n is specifically N.

According to the first aspect or any one of the forgoing possible implementation manners of the first aspect, in an eleventh possible implementation manner of the first aspect, the 2N successively serially connected transistors are: bipolar transistors, metal-oxide-semiconductor transistors, or high-electron-mobility transistors.

According to a second aspect, an embodiment of the present invention further provides an antenna tuner, including at least two capacitive tuning apparatuses that are connected in parallel, where each capacitive tuning apparatus includes: an input end, configured to receive a radio frequency signal; a capacitive tuner, configured to tune the radio frequency signal to obtain a tuned signal; and an output end, configured to output the tuned signal; and the capacitive tuner includes: a capacitor configured to tune the radio frequency signal, and the described switch according to the first aspect or any one of the possible implementation manners of the first aspect, where the switch and the capacitor are serially connected, and the switch, under control of the switch control signal, is capable of selectively coupling the radio frequency signal to the capacitor, so that the radio frequency signal is tuned by using the capacitor.

According to the second aspect, in a first possible implementation manner of the second aspect, the tuner further includes: at least one inductive tuning apparatus, wherein each inductive tuning apparatus includes one or more inductors, configured to: on basis of the at least two capacitive tuning apparatuses that are connected in parallel, further tune the radio frequency signal that has been tuned or not tuned yet by the at least two capacitive tuning apparatuses that are connected in parallel.

According to the second aspect or the first possible implementation manner of the second aspect, in a second possible implementation manner of the second aspect, a value of the capacitor can be adjusted by a capacitor control signal or is constant.

According to a third aspect, an embodiment of the present invention further provides a radio frequency apparatus, including an antenna and the described tuner according to the second aspect or any one of the possible implementation manners of the second aspect, where the antenna is configured to receive the tuned signal from the tuner, and send the tuned signal.

According to the third aspect, in a possible implementation manner of the third aspect, the radio frequency apparatus further includes: a radio frequency processing module, configured to modulate a baseband signal to obtain the radio frequency signal, and supply the radio frequency signal to the tuner.

The embodiments of the present invention provide a switch, an antenna tuner including a corresponding switch, and a related radio frequency apparatus. Multiple successively serially connected transistors are divided into a group of transistors with sequence numbers being odd numbers and a group of transistors with sequence numbers being even numbers, and gate resistor based isolation is performed separately on control ends of the transistors in each group, so that a gate leakage current of a transistor can be properly reduced, and a quantity of serially connected resistors of gates of transistors can be properly reduced, thereby achieving a trade-off between suppression of a leakage current and transmission efficiency, and more comprehensively improving an adjustment effect.

BRIEF DESCRIPTION OF DRAWINGS

To describe the technical solutions in the embodiments of the present invention or in the prior art more clearly, the following briefly introduces the accompanying drawings required for describing the embodiments or the prior art. Apparently, the accompanying drawings in the following description show merely some embodiments of the present invention or the prior art, and a person of ordinary skill in the art may still derive other drawings from these accompanying drawings without creative efforts.

DESCRIPTION OF EMBODIMENTS

The following clearly describes the technical solutions in the embodiments of the present invention with reference to the accompanying drawings in the embodiments of the present invention. Apparently, the described embodiments are merely a part rather than all of the embodiments of the present invention. All other embodiments obtained by a person of ordinary skill in the art based on the embodiments of the present invention without creative efforts shall fall within the protection scope of the present invention.

Figure 5:
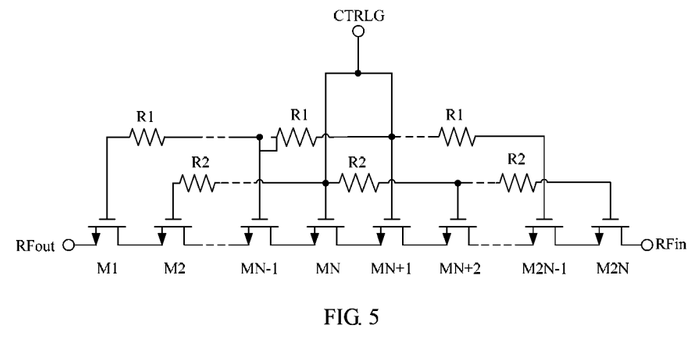
FIG. 5 is a simplified schematic diagram of a switch according to an embodiment of the present invention.

FIG. 5 is a simplified schematic structural diagram of a switch according to an embodiment of the present invention, where the switch includes: 2N successively serially connected transistors. For ease of description, the 2N successively serially connected transistors are successively assigned with sequence numbers a first transistor M1, . . . , a (2N−1)-th transistor M2N−1, and a 2N-th transistor M2N, where N is an integer greater than or equal to 2. It should be understood that in the embodiment, the assignment of the sequence numbers to these serially connected transistors is merely for describing the technical solution of the embodiment of the present invention more clearly, so that a person skilled in the art can clearly understand a connection relationship between different transistors that are serially connected, but these sequence numbers do not have any technical meaning, and these sequence numbers merely indicate relative positions of the different transistors. For example, according to the sequence numbers assigned in the embodiment, the transistor M1 and the transistor M2 are adjacent transistors, and the transistor M1 and the transistor M3 are separated by the transistor M2. An involved sequence number in the embodiment may not be marked on an actual transistor product in an actual project, or a reference sign or a name of an actual transistor product may be different from a transistor sequence number provided in the embodiment, but it should be understood that, any solution that provides a circuit structure being substantially the same as the structure described by the embodiment shall fall within the protection scope of the present invention. According to the forgoing sequence number assignment manner, the transistors M1, M3, . . . , and M2N−1 are transistors with the sequence numbers being odd numbers, and may also be called transistors in an odd-number group. The transistor M2, M4, . . . , and M2N are transistors with the sequence numbers being even numbers, and may also be called transistors in an even-number group. Control ends of each two adjacent transistors (two transistors with closest odd sequence numbers) in the transistors M1, . . . , and M2N−1 with the sequence numbers being odd numbers are coupled to each other through a first resistor R1. Control ends of each two adjacent transistors (two transistors with closest even sequence numbers) in the transistors M1, . . . , and M2N−1 with the sequence numbers being even numbers are coupled to each other through a second resistor R2. The control end of each transistor is also a gate of the transistor. In this way, the 2N serially connected transistors are divided into 2 groups. For example, in a first group of transistors with the sequence numbers being odd numbers, gates of the transistor M1 and the transistor M3 are connected through a resistor with a mark R1; by analogy, for the last two transistors in the group, gates of the transistors M2N−3 and M2N−1 are also connected through a resistor with the mark R1. In the 2N successively serially connected transistors, gates of any two adjacent transistors may be selected to receive a control signal, for example, the control ends of the n-th transistor Mn and the (n+1)-th transistor Mn+1 may be coupled to a first control signal in a switch control signal, where n may be an integer that is greater than or equal to 1 and is less than or equal to 2N−1, that is, n is a specific value, for example, the value of n may be a half of a quantity 2N of the serially connected transistors, that is N. The first control signal is used to control turn-on or turn-off of the switch. The first control signal is transmitted to a control end of a transistor with a sequence number being an odd number after passing through one or more first resistors R1, and the control signal is transmitted to a control end of a transistor with a sequence number being an even number through one or more second resistors R2. In FIG. 5, each transistor is an NMOS transistor, and the first control signal is called CTRLG, and is used to control the gates of all the transistors, that is, the forgoing control ends of these transistors. In the multiple serially connected transistors, a drain of the transistor M2N close to an input end RFin of the switch acts as signal input, and a source of the transistor M1 close to an output end RFout of the switch acts as signal output. When the CTRLG is at a high voltage level, the series of transistors M1, . . . , and M2N are all on, so that the input signal of the input end RFin is conducted to the output end RFout, that is, in this case the switch is on. If the CTRLG is at a low voltage level, all the transistors are cut off, and in this case the switch is not on, that is, the switch is off. Although the n-th transistor Mn and the (n+1)-th transistor Mn+1 may be any two adjacent transistors in the 2N serially connected transistors, however, preferably, in FIG. 5, the value of n is N. That is, in the 2N serially connected transistors in FIG. 5, the gates of the two transistors MN and MN+1 in the very middle are configured to connect to the first control signal CTRLG, and in this way, a time required for transmitting the control signal to the transistor M2N close to the RFin and a time required for transmitting the control signal to the transistor M1 close to the RFout are approximately equal, so that delay, in which the gates of the transistors M2N and M1 that are close to two ends of the switch receive the first control signal CTRLG, are close, and delay time performance is better. When N is an even number, as shown in FIG. 5, the gate of the N-th transistor MN is separately connected to the adjacent transistors MN−2 and MN+2 with even sequence numbers through a respective second resistor R2; the gate of the (N+1)-th transistor MN+1 is separately connected to the adjacent transistors MN−1 and MN+3 with odd sequence numbers through a respective first resistor R1. If N is an odd number, a difference from FIG. 5 is that: the gate of the N-th transistor MN is separately connected to the adjacent transistors MN−2 and MN+2 with odd sequence numbers through a respective first resistor R1; and the gate of the (N+1)-th transistor MN+1 is separately connected to the adjacent transistors MN−1 and MN+3 with odd sequence numbers through a respective second resistor R2. Definitely, FIG. 5 is merely an example, the n-th transistor Mn and the (n+1)-th transistor Mn+1 that are configured to receive a switch control signal may also be any other two adjacent transistors in the switch, that is, the value of n may not be fixed, which does not affect implementation of the embodiment of the present invention.

It should be noted that "first", "second", or "n-th" mentioned in each embodiment provided by the present invention has no technical meaning, which is merely for distinguishing a different element, so as to conveniently describe a connection relationship between elements, and is not intended to distinguish manufacturing technologies, materials, or parameter values of different elements. For example, a resistor between any two transistors with closest odd sequence numbers may be called a first resistor, and the resistor is different from a resistor between any two transistors with closest even sequence numbers, that is, a second resistor. However, there is no necessary connection between the first resistor and the second resistor regarding selection of a resistance value, a manufacturing process, and a material, where both may have the same or different resistance values, and may use the same or different materials. Moreover, in the embodiment, there may be multiple first resistors or second resistors, and multiple first resistors are merely taken as an example, resistance values of the first resistors may be the same, and may also be mutually different. Therefore, a person skilled in the art should understand that the description "first" or "second" should not be construed as a limit to the technical solution.

Figure 6:
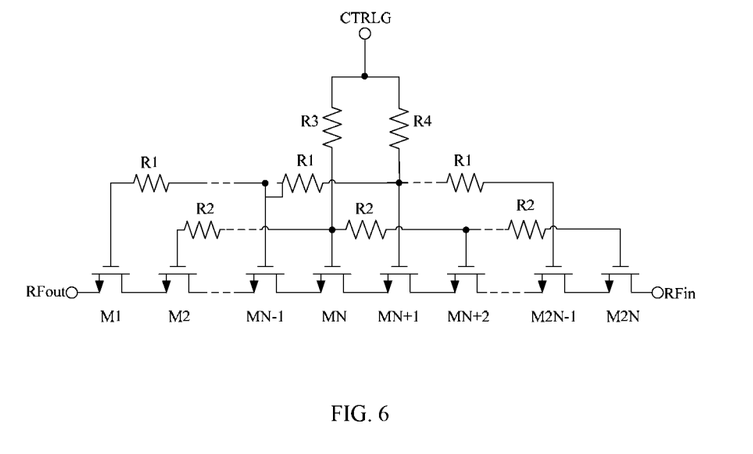
FIG. 6 is a simplified schematic diagram of a switch according to an embodiment of the present invention.

Further, in order to improve an effect of resistor isolation, as shown in FIG. 6, based on FIG. 5, in the two transistors in the very middle, the control end of the N-th transistor MN is coupled to the first control signal CTRLG through a third resistor R3, and the control end of the (N+1)-th transistor MN+1 is coupled to the first control signal CTRLG through a fourth resistor R4. When the N-th transistor MN and the (N+1)-th transistor MN+1 in FIG. 5 are directly connected to the CTRLG, if the degree of isolation is still inadequate, in order to improve isolation performance, a resistor may further be added between the gates of the two transistors MN and MN+1 and the CTRLG to perform isolation, as in FIG. 6. In FIG. 6, N is an even number, the added resistor R3 may also be serially connected to one or more second resistors R2 to improve the degree of isolation from each transistor with the sequence number being an even number to the CTRLG; and the added resistor R4 may also be serially connected to one or more first resistors R1 to improve the degree of isolation from each transistor with the sequence number being an odd number to the CTRLG.

Figure 7:
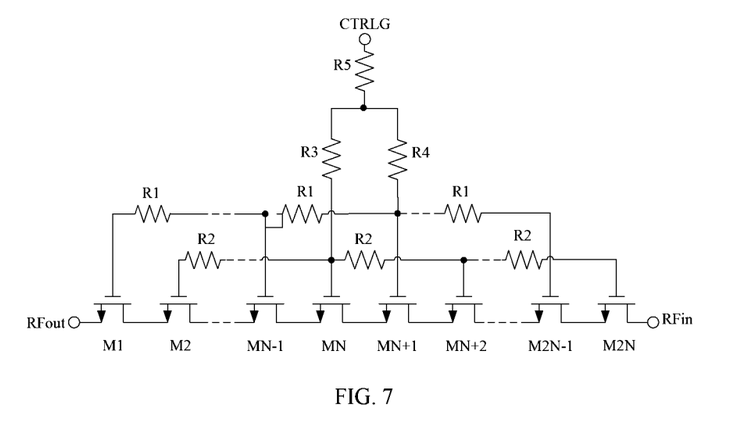
FIG. 7 is a simplified schematic diagram of another switch according to an embodiment of the present invention.

Further, based on FIG. 6, FIG. 7 provides an improved solution. A first end of the third resistor R3 in FIG. 7 is connected to the control end of the N-th transistor MN, and a second end of the third resistor R3 is connected to a first end of a fifth resistor R5; a first end of the fourth resistor R4 is connected to the control end of the (N+1)-th transistor MN+1, and a second end of the fourth resistor R4 is connected to the first end of the fifth resistor R5; and a second end of the fifth resistor R5 is coupled to the first control signal CTRLG. In FIG. 7, the resistors R3 and R4 are further connected to the CTRLG through the resistor R5, so that resistor isolation from the gate of each transistor to the CTRLG is further improved.

Figure 8:
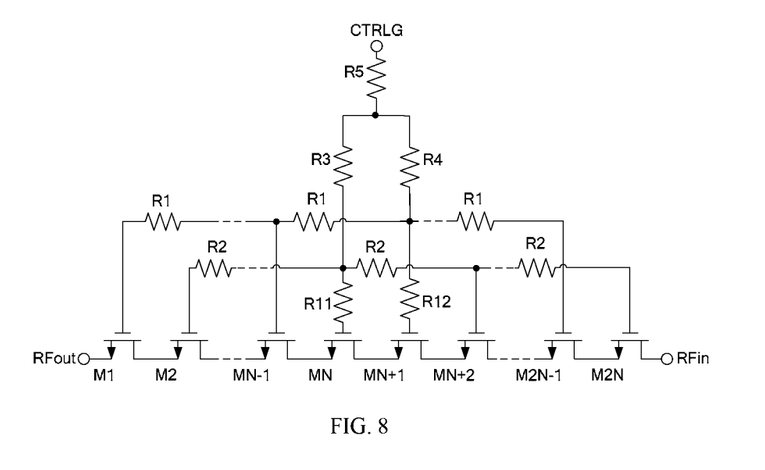
FIG. 8 is a simplified schematic diagram of another switch according to an embodiment of the present invention.

Further, based on FIG. 7, an improved solution is shown in FIG. 8: the control end of the N-th transistor MN is connected to the third resistor R3 through an eleventh resistor R11, and the control end of the N-th transistor and the second resistor R2 that is connected to the N-th transistor are coupled to each other through the eleventh resistor R11. Specifically, in FIG. 8, N is an even number, the gates of the transistors MN−2 and MN+2, adjacent to the N-th transistor MN, with closest even sequence numbers are separately connected to the gate of the N-th transistor MN through the respective second resistor R2 and the eleventh resistor R11, and therefore, in addition to being connected to the third resistor R3, the eleventh resistor R11 is also connected to two second resistors R2. The control end of the (N+1)-th transistor is connected to a fourth resistor R4 through a twelfth resistor R12, and the control end of the (N+1)-th transistor and at least one first resistor R1 connected to the (N+1)-th transistor are coupled to each other through the twelfth resistor R12. Specifically, in FIG. 8, N+1 is an odd number, the gates of the transistors MN−1 and MN+3, adjacent to the (N+1)-th transistor MN+1, with closest odd sequence numbers are separately connected to the gate of the (N+1)-th transistor MN+1 through the respective first resistor R1 and the twelfth resistor R12, and therefore, in addition to being connected to the fourth resistor R4, the twelfth resistor R12 is also connected to two first resistors R1. Transistors that receive the control signal are MN and MN+1, which are transistors that are of the switch and close to a center, and therefore delays of transmission of the control signal to the gates of the transistors on two sides are very close, which facilitates improvement of performance of the switch. Definitely, if one transistor that receives the control signal is not a transistor that is close to the center of the series of serially connected transistors, but a transistor that is close to either end of the switch, for example, the first transistor M1, the first transistor M1 has merely one third transistor M3 with a closest odd sequence number, so that in this case the gate of the first transistor M1 is connected to merely the gate isolation resistor R1 of the third transistor M3 through the eleventh resistor R11.

Figure 9:
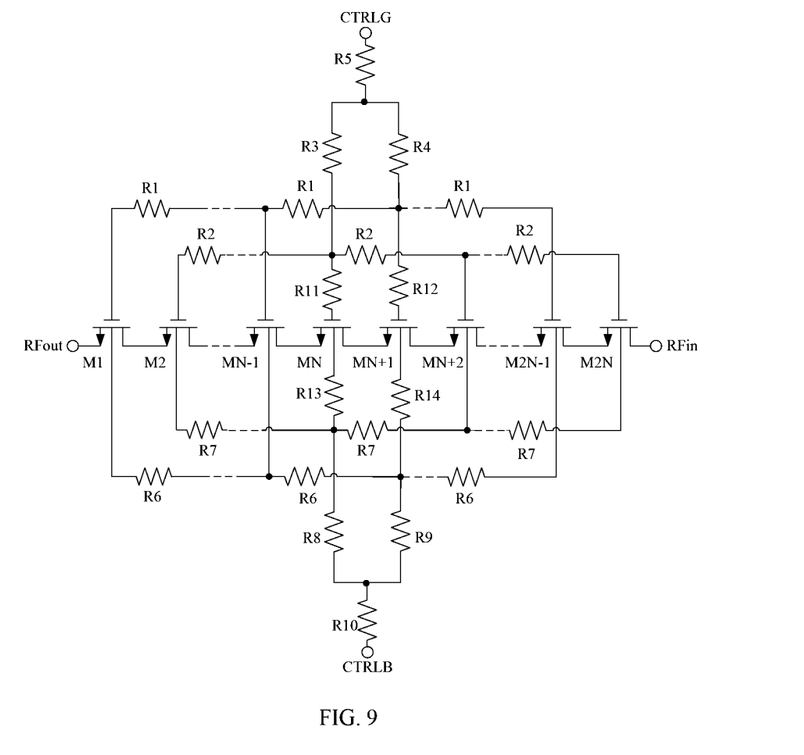
FIG. 9 is a simplified schematic diagram of another switch according to an embodiment of the present invention.

Further, based on FIG. 8, a resistor may be added to a substrate of each transistor to perform isolation, so as to further reduce a substrate leakage current, and in addition to the transistor gate resistor isolation, the isolation at the substrate can further achieve a better effect of isolating a leakage current. Specifically as shown in FIG. 9, all the transistors may be integrated to an integrated circuit, and the substrate of each transistor is a body (Body) of the integrated circuit. Substrates of any two transistors with closest odd sequence numbers are coupled to each other through a sixth resistor R6; and substrates of any two transistors with closest even sequence numbers are coupled to each other through a seventh resistor R7. The substrate of the N-th transistor MN is coupled to a second control signal CTRLB in the switch control signal, and the substrate of the (N+1)-th transistor MN+1 is coupled to the second control signal CTRLB, where the second control signal CTRLB is used to control voltage levels of the substrates of the 2N successively serially connected transistors. How voltage level control is performed on a substrate of a transistor may be implemented in the prior art. Specifically, for the transistors in FIG. 9, the transistors are NMOS transistors, so that the CTRLB may be grounded all the time Alternatively, different from FIG. 9, if the 2N transistors are replaced by PMOS transistors, when a gate control signal, that is, the forgoing first control signal CTRLG is at a high voltage level, these transistors are off, so that the entire switch is off; and when the CTRLG is at a low voltage level, these transistors are on, so that the entire switch is on, and in this case, the CTRLB is connected to the high voltage level all the time.

Definitely, the CTRLB may not be connected to a constant voltage level all the time. For example, FIG. 9 is still taken as an example, if the CTRLG is at a high voltage level, the switch is on, and in this case the CTRLB is grounded, that is, the voltage level is zero; and if the CTRLG is at a low voltage level, the switch is off, and in this case the CTRLB is connected to a negative voltage level to reduce the substrate leakage current. For more information on how the voltage level of the substrate of the transistor is adjusted by using the CTRLB, reference may be made to the prior art, which is not repeated in the embodiment.

In FIG. 9, in order to further improve substrate isolation performance, the substrate of the N-th transistor MN is coupled to the second control signal CTRLB through an eighth resistor R8, and the substrate of the (N+1)-th transistor MN+1 is coupled to the second control signal CTRLB through a ninth resistor R9. In order to further improve the substrate isolation performance, a first end of the eighth resistor R8 is connected to the substrate of the N-th transistor MN, and a second end of the eighth resistor R8 is connected to a first end of a tenth resistor R10; a first end of the ninth resistor R9 is connected to the substrate of the (N+1)-th transistor MN+1, and a second end of the ninth resistor R9 is connected to the first end of the tenth resistor R10; and a second end of the tenth resistor R10 is coupled to the second control signal CTRLB. In FIG. 9, the substrate of the N-th transistor MN is coupled to the CTRLB through multiple resistors, an isolation feature is improved, and delays required for transmitting a signal of the CTRLB to transistors at both ends are close, which facilitates performance optimization. It can be understood that, a principle of substrate current leakage is similar to that of a gate leakage current, so that in FIG. 9, a structure used by resistor isolation of a substrate is similar to that of a gate, and gate isolation and substrate isolation are in a symmetric or an approximately symmetric relationship.

Figure 10:
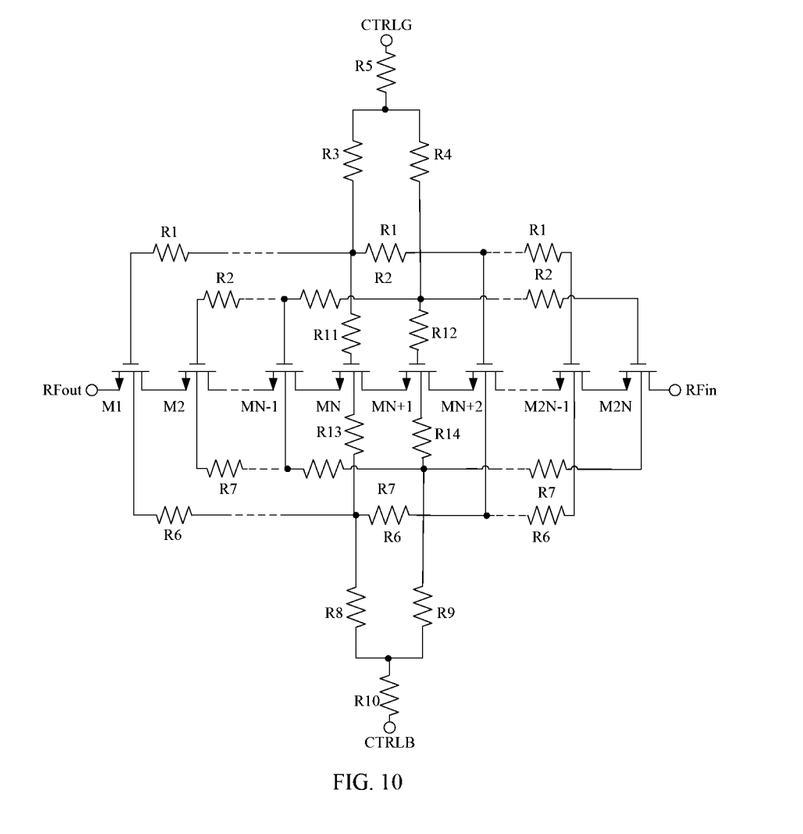
FIG. 10 is a simplified schematic diagram of another switch according to an embodiment of the present invention.

It can be understood that, in FIG. 5 to FIG. 9, N is an even number, the N-th transistor MN is connected to gates of other transistors with closest even sequence numbers through a second resistor R2, and the (N+1)-th transistor MN+1 is connected to gates of other transistors with closest odd sequence numbers through a first resistor R1. If N is an odd number, as shown in FIG. 10, the N-th transistor MN is separately connected to the gates of the transistors MN−2 and MN+2 with closest odd sequence numbers through the respective first resistor R1, and the (N+1)-th transistor MN+1 is separately connected to the gates of the transistors MN−1 and MN+3 with closest even sequence numbers by the respective second resistor R2. Similarly, in FIG. 10, the N-th transistor MN is separately connected to the substrates of transistors MN−2 and MN+2 through the respective sixth resistor R6, and the (N+1)-th transistor MN+1 is separately connected to the substrates of transistors MN−1 and MN+3 through the respective seventh resistor R7.

It should be noted that, in the preceding embodiment, the 2N successively serially connected transistors are all NMOS transistors in the accompanying drawing; and as mentioned in the forgoing embodiment, the 2N successively serially connected transistors may also be PMOS transistors, and a function similar to that of an NMOS transistor may be implemented by merely changing a voltage level design of CTRLG and CTRLB, details of which may be referred to a conventional design in the field. In a design scheme, for a switch including multiple serially connected PMOS transistors, the switch is off when the CTRLG is at a high voltage level, the switch is on when the CTRLG is at a low voltage level, and the CTRLB may be connected to the high voltage level all the time. Alternatively, the CTRLB may be set to twice the high voltage level when the CTRLG is at the high voltage level, and may be set to the high voltage level when the CTRLG is at the low voltage level, to better suppress the substrate leakage current.

Definitely, a type of the transistor used in the switch may not be limited merely to an MOS transistor, and may also be a bipolar transistor, a high-electron-mobility transistor, or the like. A transistor achieved by using whatever process does not affect implementation of a circuit structure in the embodiment of the present invention. In the embodiment, gate resistor based isolation and substrate resistor based isolation are separately performed on multiple transistors with sequence numbers being odd numbers and multiple transistors with sequence numbers being even numbers, so that a trade-off between isolation performance and a control signal transmission delay is implemented; voltage level designs of control signals CTRLG and CTRLB that are used to control the switch may be adaptively adjusted, that is, specific voltage level values of the CTRLG and the CTRLB may be flexibly set according to a type difference of a transistor that is specifically used, which depends on a process required for implementing a transistor. For details, reference may be made to the prior art, which is not repeated in this embodiment.

Figure 11:
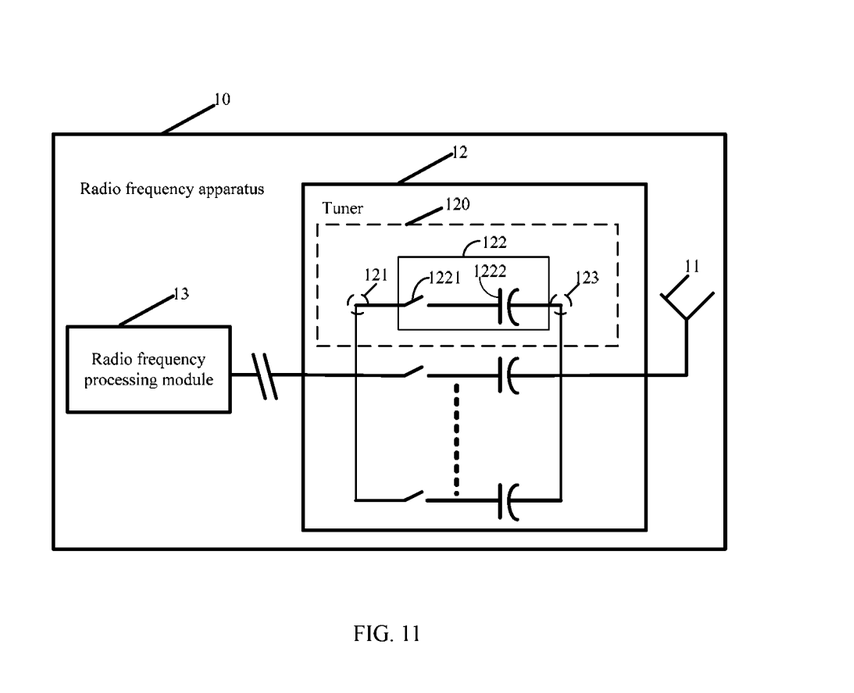
FIG. 11 is a simplified schematic diagram of a radio frequency apparatus including an antenna tuner having a switch with improved performance according to an embodiment of the present invention.

Based on the forgoing embodiment, FIG. 11 provides a simplified schematic structural diagram of a radio frequency apparatus, where the radio frequency apparatus 10 includes an antenna 11, a tuner 12, and a radio frequency processing module 13. Similar to FIG. 1 in the prior art, the radio frequency processing module 13 is configured to modulate an analog baseband signal produced by a baseband processing chip or a baseband processing module to obtain the radio frequency signal, and provide the radio frequency signal to the tuner 12. The modulation process generally is a signal up-conversion process, that is, the analog baseband signal is up-converted into the radio frequency signal with a higher frequency. The radio frequency processing module 13 may specifically perform the modulation operation by using a transmit link, and definitely, similar to FIG. 1 in the background, the radio frequency processing module 13 may further include a receive link for demodulating a signal received from the antenna.

In FIG. 11, after the radio frequency processing module 13 performs modulation and obtains the radio frequency signal, the radio frequency signal may be coupled to the tuner 12 through a single-pole double-throw switch. Definitely, it is also acceptable that the radio frequency module has only a transmit link, signal receiving may be implemented by using another independent radio frequency processing module having a receive link, and in this case the single-pole double-throw switch may not be needed to switch between the transmit link and the receive link, because two independent radio frequency modules may use different antennas. FIG. 11 in the embodiment of the present invention mainly describes generation, tuning, and a sending process of the radio frequency signal, but imposes no limitation on a receiving manner.

Specifically, in FIG. 11, the tuner 12 is configured to tune impedance of the antenna 11. The tuner 12 is coupled to the radio frequency processing module 13 in a manner, receives a radio frequency signal from the radio frequency processing module 13, tunes the radio frequency signal, and sends a tuned signal to the antenna 11, so that the antenna 11 receives the tuned signal, and sends the tuned signal. The tuner 12 may include at least two capacitive tuning apparatuses 120 that are connected in parallel, where each capacitive tuning apparatus 120 includes: an input end 121, configured to receive a radio frequency signal; a capacitive tuner 122, configured to tune the radio frequency signal to obtain a tuned signal; and an output end 123, configured to output the tuned signal. The capacitive tuner 122 includes: a capacitor 1222 that is configured to tune the radio frequency signal and a switch 1221, where the switch 1221 and the capacitor 1222 are serially connected, and a sequence of the switch 1221 and the capacitor 1222 may be adjusted, and is not fixed. For a specific structure of the switch 1221, reference may be made to the description of the foregoing embodiment, and under control of the switch control signal, for example, under control of the CTRLG, the switch 1221 may selectively couple the radio frequency signal to the capacitor 1222, so that the radio frequency signal is tuned by using the capacitor 1222. Specifically, when one switch 1221 is on, the capacitor 1222 that is serially connected to the switch 1221 is connected to the radio frequency signal and performs a tuning function; and when the switch 1221 is off, the radio frequency signal does not pass the capacitor 1222, and therefore, the capacitor 1222 does not perform the tuning function. A value of the capacitor 1222 in any capacitive tuning apparatus 120 may further be adjusted by a capacitor control signal or set to a constant value. If a value of one capacitor 1222 is adjustable by the capacitor control signal, adjustment of a capacitance value of the capacitive tuning apparatus 120 where the capacitor 1222 is located is more flexible, so that an adjustment range of the capacitance value of the tuner 12 becomes larger, and a better adjustment effect is achieved. Definitely, in some application scenarios, in order to improve tuning performance, the tuner 12 may further include: at least one inductive tuning apparatus, where each inductive tuning apparatus includes one or more inductors, configured to: on basis of the at least two capacitive tuning apparatuses 120 that are connected in parallel, further tune the radio frequency signal that has been tuned or not tuned yet by the at least two capacitive tuning apparatuses 120 that are connected in parallel. The at least one inductive tuning apparatus and the at least two capacitive tuning apparatuses 120 that are connected in parallel may be connected in parallel or serially connected, of which a specific structure and a connection relationship depend on industrially required performance and a choice made by a manufacturer, and details are not provided in the embodiment. Definitely, what FIG. 11 provides is merely an example, and in a specific implementation, the tuner 12 may further include another element that is configured to tune a signal, for example, a resistor or any type of transistor, and a structure of the tuner 12 does not affect a role played by the switch in the tuner 12, where the switch is provided by the embodiment of the present invention. Due to process implementation complexity, the radio frequency processing module 13 and the tuner 12 in FIG. 11 are generally not integrated to one integrated circuit. The tuner 12 may be integrated, where all elements and components in the tuner 12 may be manufactured on one substrate by using an integrated circuit process, but the embodiment does not exclude a solution in which all elements and components in the tuner 12 may be separately placed on substrates of different integrated circuits. The transistors in the switch 1221 provided by the embodiment are generally integrated together, that is, placed on one substrate, and definitely, it is also acceptable that different transistors in the switch 1221 are placed on substrates of different integrated circuits. The embodiment imposes no limitation on a specific manufacturing process or a specific packaging process used by any functional module or circuit element.

It can be seen from the forgoing embodiment that, before being sent, a radio frequency signal is tuned by a tuner, which may improve signal sending performance, so that impedance of an antenna better matches a required radio frequency. In the tuner, when multiple fixed or variable capacitors are controlled by using a switch to change a capacitance value of the entire tuner, performance of the switch is very important. The embodiment of the present invention, comprehensively considers suppression of a substrate leakage current and a gate leakage current that are of a switch and a delay problem of transmission when a switch control signal is transmitted to a series of transistors, so that trade-off is achieved on the performance of the switch, and the performance of the switch is optimized, thereby improving transmit performance of the radio frequency apparatus.

It may be understood that the forgoing radio frequency apparatus may be applied to various wireless communications devices, for example, a base station, a repeater station, a wireless terminal, an FM (Frequency Modulation, frequency modulation) device, a Bluetooth device, or a WiFi (Wireless Fidelity) device. Application of the device is not limited by a wireless communications protocol, and the apparatus may be widely applied to various wireless communications protocols, for example, an LTE (Long Term Evolution), WCDMA (Wideband Code Division Multiple Access), WiFi, Bluetooth, or GSM (Global System for Mobile Communications) standard. When the apparatus is applied to a wireless terminal, a form of the terminal may be a laptop computer, a tablet computer, a smart phone, a date card, a walkie-talkie, or the like, which is not limited by the embodiment.

A structure of the switch provided by the embodiment can achieve a desirable application effect in a high frequency or radio frequency circuit, especially in a circuit of a radio frequency apparatus, and the switch may also be applied to some other scenarios, for example, applied to a phase-locked loop, sampling and readout circuits of a sensor, and the like, which are not limited to merely the application scenario provided by FIG. 11.

In addition, "coupling" or "connection", mentioned in the embodiments, between different elements, should be understood as a connection in any form, for example, a connection through a wire or through other one or more elements instead of a connection by directly using merely a wire.

The foregoing are merely exemplary embodiments of the present invention. A person skilled in the art may make various modifications and variations to the present invention without departing from the spirit and scope of the present invention. A person of ordinary skill in the art can understand that the embodiments or features of different embodiments may be combined with each other to form a new embodiment if there is no conflict.

What is claimed is:

1. A switch comprising:
   2N successively serially connected transistors, and wherein N is an integer greater than or equal to 2;
   the 2N successively serially connected transistors are divided into groups of odd and even numbered transistors such that the odd numbered transistors are arranged to be interleaved with the even numbered transistors so that a pair of neighboring transistors of one group is separated by a transistor of the other group;
   control ends of any two transistors in the odd-numbered group with closest odd sequence numbers are coupled to each other through a first resistor;
   control ends of any two transistors in the even-numbered group with closest even sequence numbers are coupled to each other through a second resistor; and
   control ends of n-th and (n+1)-th transistors in the 2N successively serially connected transistors are coupled to a first control signal,
   wherein the control ends are gates and n is an integer that is greater than or equal to 1 and is less than or equal to 2N−1, and the first control signal is used to control turn-on or turn-off of the switch.

2. The switch according to claim 1, wherein the control end of the n-th transistor is coupled to the first control signal through a third resistor, and the control end of the (n+1)-th transistor is coupled to the first control signal through a fourth resistor.

3. The switch according to claim 2, wherein a first end of the third resistor is connected to the control end of the n-th transistor, and a second end of the third resistor is connected to a first end of a fifth resistor; a first end of the fourth resistor is connected to the control end of the (n+1)-th transistor, and a second end of the fourth resistor is connected to the first end of the fifth resistor; and a second end of the fifth resistor is coupled to the first control signal.

4. The switch according to claim 3, wherein n is an odd number that is greater than or equal to 1 and less than or equal to 2N−1;
the control end of the n-th transistor is connected to the third resistor through an eleventh resistor, and the control end of the n-th transistor and at least one first resistor that is connected to the n-th transistor are coupled to each other through the eleventh resistor; and
the control end of the (n+1)-th transistor is connected to the fourth resistor through a twelfth resistor, and the control end of the (n+1)-th transistor and at least one second resistor that is connected to the (n+1)-th transistor are coupled to each other through the twelfth resistor.

5. The switch according to claim 3, wherein n is an even number that is greater than and less than 2N−1;
the control end of the n-th transistor is connected to the third resistor through an eleventh resistor, and the control end of the n-th transistor and at least one second resistor that is connected to the n-th transistor are coupled to each other through the eleventh resistor; and
the control end of the (n+1)-th transistor is connected to the fourth resistor through a twelfth resistor, and the control end of the (n+1)-th transistor and at least one first resistor that is connected to the (n+1)-th transistor are coupled to each other through the twelfth resistor.

6. The switch according to claim 1, wherein, in the transistors in the odd-number group, substrates of the any two transistors with closest odd sequence numbers are coupled to each other through a sixth resistor; and
in the transistors in the even-number group, substrates of the any two transistors with closest even sequence numbers are coupled to each other through a seventh resistor; wherein
a substrate of the n-th transistor is coupled to a second control signal in the switch control signal, a substrate of the (n+1)-th transistor is coupled to the second control signal, and the second control signal is used to control voltage levels of substrates of the 2N successively serially connected transistors.

7. The switch according to claim 6, wherein the substrate of the n-th transistor is coupled to the second control signal through an eighth resistor, and the substrate of the (n+1)-th transistor is coupled to the second control signal through a ninth resistor.

8. The switch according to claim 7, wherein a first end of the eighth resistor is connected to the substrate of the n-th transistor, and a second end of the eighth resistor is connected to a first end of a tenth resistor; a first end of the ninth resistor is connected to the substrate of the (n+1)-th transistor, and a second end of the ninth resistor is connected to the first end of the tenth resistor; and a second end of the tenth resistor is coupled to the second control signal.

9. The switch according to claim 8, wherein n is an odd number that is greater than or equal to 1 and less than or equal to 2N−1;
the substrate of the n-th transistor is connected to the eighth resistor through a thirteenth resistor, and the substrate of the n-th transistor and at least one sixth resistor that is connected to the n-th transistor are coupled to each other through the thirteenth resistor; and
the substrate of the (n+1)-th transistor is connected to the ninth resistor through a fourteenth resistor, and the substrate of the (n+1)-th transistor and at least one seventh resistor that is connected to the (n+1)-th transistor are coupled to each other through the fourteenth resistor.

10. The switch according to claim 8, wherein n is an even number that is greater than 1 and less than 2N−1;
the substrate of the n-th transistor is connected to the eighth resistor through a thirteenth resistor, and the substrate of the n-th transistor and at least one seventh resistor that is connected to the n-th transistor are coupled to each other through the thirteenth resistor; and
the substrate of the (n+1)-th transistor is connected to the ninth resistor through a fourteenth resistor, and the substrate of the (n+1)-th transistor and at least one sixth resistor that is connected to the (n+1)-th transistor are coupled to each other through the fourteenth resistor.

11. The switch according to claim 1, wherein a value of n is equal to N.

12. The switch according to claim 1, wherein the 2N successively serially connected transistors are: bipolar transistors.

13. An antenna tuner, comprising at least two capacitive tuning apparatuses that are connected in parallel, wherein each capacitive tuning apparatus comprises:
an input end, configured to receive a radio frequency signal;
a capacitive tuner including a capacitor, configured to tune the radio frequency signal to obtain a tuned signal;
an output end, configured to output the tuned signal; and
a switch comprising:
2N successively serially connected transistors and N is an integer greater than or equal to 2;
wherein the 2N successively serially connected transistors are divided into groups of odd and even numbered transistors;
control ends of any two transistors in the odd-numbered group with closest odd sequence numbers are coupled to each other through a first resistor;
control ends of any two transistors in the even-numbered group with closest even sequence numbers are coupled to each other through a second resistor;
control ends of n-th and (n+1)-th transistors in the 2N successively serially connected transistors are coupled to a first control signal, and
wherein n is an integer that is greater than or equal to 1 and is less than or equal to 2N−1, and the first control signal is used to control turn-on or turn-off of the switch
wherein the switch and the capacitor are serially connected, and the switch, under control of the switch control signal, is capable of selectively coupling the radio frequency signal to the capacitor, so that the radio frequency signal is tuned by using the capacitor.

14. The tuner according to claim 13, wherein the tuner further comprises: at least one inductive tuning apparatus, wherein each inductive tuning apparatus comprises one or more inductors, configured to: on basis of the at least two capacitive tuning apparatuses that are connected in parallel, further tune the radio frequency signal that has been tuned or not tuned yet by the at least two capacitive tuning apparatuses that are connected in parallel.

15. The tuner according to claim 13, wherein a value of the capacitor can be adjusted by a capacitor control signal.

16. The tuner according to claim 13, wherein a value of the capacitor is constant.

17. A radio frequency apparatus, comprising:
an antenna; and
a tuner;
wherein the tuner comprises at least two capacitive tuning apparatuses connected in parallel, each capacitive tuning apparatus comprising: an input end configured to receive a radio frequency signal, a capacitive tuner configured to tune the radio frequency signal to obtain a tuned signal, and an output end configured to output the tuned signal; and
wherein the capacitive tuner comprises a capacitor configured to tune the radio frequency signal, and
a switch;
wherein the switch comprises: 2N successively serially connected transistors and wherein N is an integer greater than or equal to 2;
the 2N successively serially connected transistors are divided into groups of odd and even numbered transistors;
control ends of any two transistors in the odd-numbered group with closest odd sequence numbers are coupled to each other through a first resistor;
control ends of any two transistors in the even-numbered group with closest even sequence numbers are coupled to each other through a second resistor;
control ends of n-th and (n+1)-th transistors in the 2N successively serially connected transistors are coupled to a first control signal, and
wherein n is an integer that is greater than or equal to 1 and is less than or equal to 2N−1, and the first control signal is used to control turn-on or turn-off of the switch;
wherein the switch and the capacitor are serially connected, and the switch, under control of the switch control signal, is capable of selectively coupling the radio frequency signal to the capacitor, so that the radio frequency signal is tuned by using the capacitor;
the antenna is configured to receive the tuned signal from the tuner, and send the tuned signal.

18. The radio frequency apparatus according to claim 17, further comprising: a radio frequency processing module, configured to modulate a baseband signal to obtain the radio frequency signal, and supply the radio frequency signal to the tuner.

19. The switch according to claim 1, wherein the 2N successively serially connected transistors are: metal-oxide-semiconductor transistors.

20. The switch according to claim 1, wherein the 2N successively serially connected transistors are: high-electron-mobility transistors.

* * * * *